March 2, 1971 D. M. BROWN ET AL 3,566,517
SELF-REGISTERED IG-FET DEVICES AND METHOD OF MAKING THE SAME
Filed Oct. 13, 1967 2 Sheets-Sheet 1
Fig. 1.
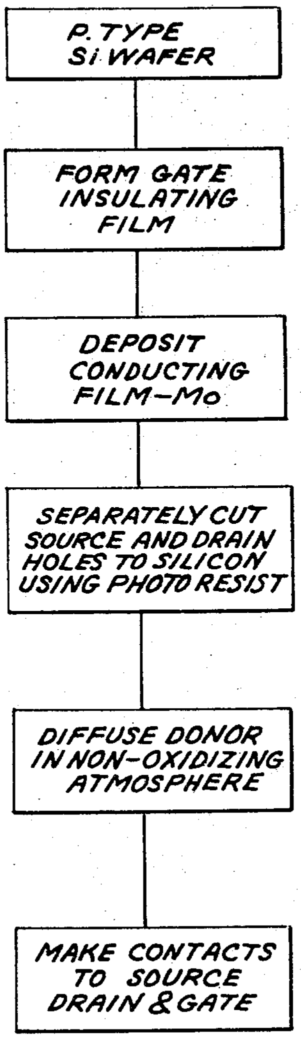
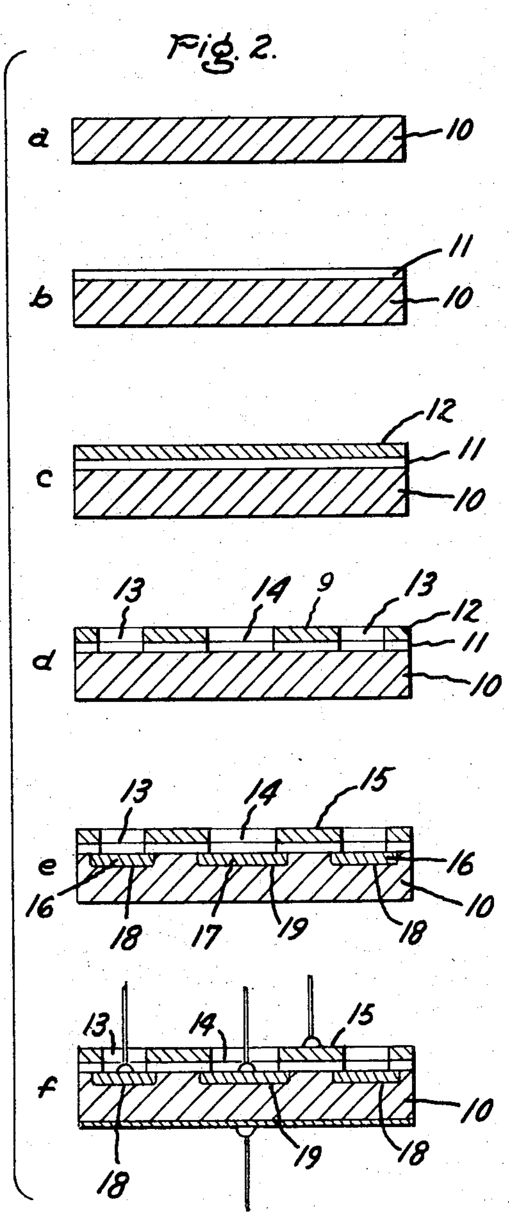
Fig. 5.
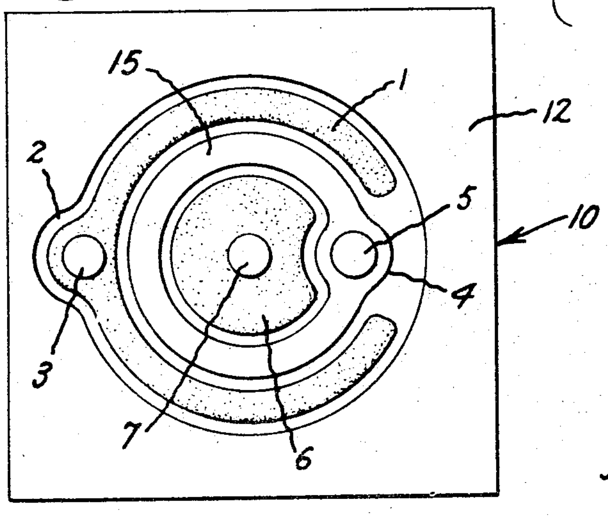
Inventors:
Dale M. Brown,
William E. Engeler,
Peter V. Gray,
Marvin Garfinkel,
by John F. Ahern
Their Attorney.

SELF-REGISTERED IG-FET DEVICES AND METHOD OF MAKING THE SAME

Filed Oct. 13, 1967 2 Sheets-Sheet 2

Inventors:
Dale M. Brown,
William E. Engeler,
Peter V. Gray,
Marvin Garfinkel,
by John F. Ahern
Their Attorney.

United States Patent Office 3,566,517

Patented Mar. 2, 1971

3,566,517

SELF-REGISTERED IG-FET DEVICES AND METHOD OF MAKING SAME

Dale M. Brown, Schenectady, and William E. Engeler, Peter V. Gray, and Marvin Garfinkel, Scotia, N.Y., assignors to General Electric Company Filed Oct. 13, 1967, Ser. No. 675,228
Int. Cl. B01j *17/00;* H01g *13/00*
U.S. Cl. 29—571 11 Claims

ABSTRACT OF THE DISCLOSURE

Self-registered field-effect transistors are built by forming the gate thereof at the same time the channel-adjacent portion of the source and drain regions are defined. In one embodiment a refractory metallic film is deposited over an insulating film and etched to form the gate. Subsequently, the metallic film may serve as a diffusion mask, although this is not essential. The metallic film is patterned by photoresist masking and etching. The portion of the metallic film overlying the channel region of the semiconductor body thereof is used as a gate. As a result of simultaneous definition of the channel-adjacent portions of source and drain regions and patterning of the channel-aligned portions of the gate, when source and drain regions are formed by diffusion of activators into the silicon wafer, automatic registration of the gate-adjacent portions of the source and drain junctions beneath the gate is achieved.

Figure 3:
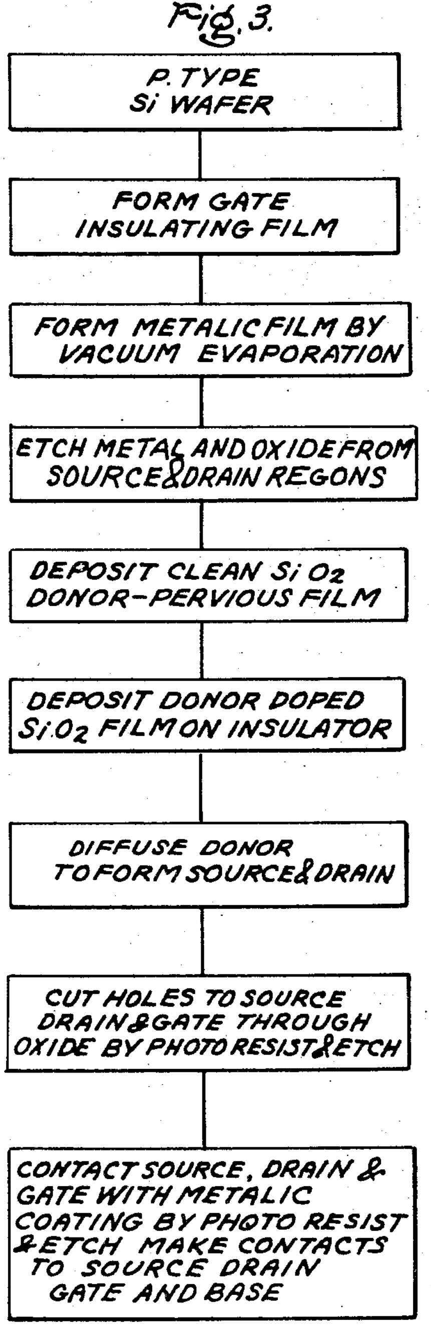

This application is related to the copending concurrently filed applications: S.N. 675,225, Engeler; S.N. 679,957, Brown and Engeler; S.N. 675,227, now abandoned, Brown and Garfinkel; and S.N. 675,226, now abandoned, Brown and Engeler.

THE DISCLOSURE

The present invention relates to insulated gate field-effect transistor (IG-FET) devices wherein conduction between a source and a drain region through a surface-adjacent channel of a semiconductor body is modulated by the application of a potential to a gate which is positioned adjacent the channel region between the source and drain regions and electrically insulated therefrom. More particularly, the present invention is directed to such devices and methods for the formation thereof, wherein automatic registration is obtained without the necessity of difficult mask registration and wherein improved electrical characteristics result.

In the technology of forming IG-FET devices, it is a necessary criterion that the source and drain regions of the semiconductor body, from which the device is fabricated, and which are of opposite conductivity type from the base region of the main body of the semiconductor, be in registry with the gate electrode which modulates electrical conduction in a surface-adjacent channel between the source and drain regions.

In the case of enhancement mode FET devices, it is further necessary that two boundary conditions be met. First, it is required that no portion of the channel region be exposed from under the gate. Stated differently, the gate must cover the entire channel, overlapping the intersection of the channel-adjacent portions of the source and drain junctions with the surface of the semiconductor body. If this condition is not met, the exposed channel region will constitute a very high resistance when the device is in the "on bias" condition, since at zero gate bias there are very few carriers in the channel region. As a second boundary condition, it is desirable that the overlap of the gate electrode and the source and drain region be kept to the minimum that is consistent with the achievement of the first boundary condition. The reason for this is that, to the extent that there is an overlap, a capacitance appears between the gate and the regions with which the overlap occurs. Thus, an overlap of the source with the gate results in gate to source capacitance ($C_{gs}$) and an overlap of the drain and gate results in a gate to drain capacitance ($C_{gd}$). Although these capacitances are unavoidable to a certain extent, it is desirable that they be minimized, since the amount of capacitance has an inverse affect upon the speed with which the device may be operated. Additionally, the feed-back capacitance ($C_{gd}$) is generally evidenced by a gain-enhanced input capacity which also limits the operating speed and, hence, operating frequency of the device.

In order to achieve proper registration between source, drain regions and the gate of prior art IG-FET devices, it is conventional that the overlap be obtained and controlled to the best extent possible by repetitive maskings, utilizing photolithographic techniques with photoresist compounds, as is well known to the art. It is, however, difficult to achieve identical masking with subsequent transistor fabrication steps, and it is particularly difficult to utilize successive masking when a large number of such devices are simultaneously fabricated from a single wafer of a semiconductor material which is later cut into small bits, each of which contains what is hoped to be an identical field-effect transistor, because the registration must be perfect over the entire wafer.

Accordingly, an object of the present invention is to provide improved field-effect transistors having automatic gate-channel registration, with minimum overlap of the gate with the source and drain regions, respectively.

Yet another object of the present invention is to provide improved field-effect transistor devices having minimum interregion capacitance and improved high-frequency operating characteristics.

Still another object of the present invention is to provide improved methods for the fabrication of field-effect transistors which yield automatic gate-channel registration with a minimum of process steps.

Still another object of the present invention is to provide a method for simultaneously producing many self-registered field-effect transistors upon a single substrate that is simple, easily reproducible, and inexpensive for commercial manufactures of such device.

Briefly stated, in accord with the invention, improved IG-FET devices are provided having automatic, perfect registry between source and drain regions, on one hand, and the gate thereof, on the other hand. Such devices include a conducting film which is formed over an insulation-passivation layer during fabrication and patterned by a single photolithographic process which forms the gate and also defines the channel-adjacent portions of source and drain holes. This insures automatic registry of the gate and the channel. During processing, the diffusion of source and drain regions is carefully controlled to keep overlap between gate and source and drain regions at a minimum to reduce device capacitance to a minimum to optimize high-speed operation. Additionally, gate and gate insulator, once formed, remain in place throughout the remainder of the process.

The novel features believed characteristic of the present invention are set forth in the appended claims. The invention itself, together with further objects and advantages thereof, may best be understood by reference to the following detailed description, taken in connection with the appended drawing in which:

FIG. 1 is a flow diagram which illustrates the successive steps of the production of a field-effect transistor device in accord with the present invention, FIGS. 2*a*–2*f* are schematic cross-sectional views of a field-effect transistor in the process of fabrication, each view corresponding to a process step in the flow diagram of FIG. 1, FIG. 3 is a flow diagram representing the steps in performing an alternative process wherein an improved field-effect transistor device having automatic registry is fabricated, FIGS. 4*a*–4*i* are a series of schematic vertical cross-sectional views illustrating progressive steps in the fabrication of a field-effect transistor corresponding to the various steps illustrated in the flow diagram of FIG. 3, and FIG. 5 is a plan view of a device fabricated by the steps of FIG. 1, illustrating electrode configurations.

As is set forth hereinbefore, perfect registry between the gate electrode, which modulates the flow of conduction carriers in the channel between the source and drain regions of the field-effect transistor, and the channel is essential if the device is to be useful and perform its function as desired. On the other hand, the registry must, in the commercial production of field-effect transistors, be accomplished in an easy and simple manner having the fewest number of steps so that a large number of such devices may be simultaneously formed.

In accord with one embodiment of the present invention, we provide automatic registration in IG-FET devices by utilizing a conductor which may be patterned by well-known photoresist and etching techniques to provide a pattern over the surface of an insulator which is formed upon a semiconductive substrate from which IG-FET devices are to be fabricated. The metallic film is patterned, so as to facilitate simultaneous formation of the channel-adjacent source and drain regions and formation of the gate. More simply stated, the patterned metallic film, including the gate, serves both as an etch mask to facilitate removal of the insulating film from the region at which the source and drain are to be formed, and may serve as a diffusion mask by which the channel-adjacent portions of source and drain regions are formed. A gate portion of the metallic film is positioned over the channel between the source and drain regions. An enlarged, attached region of this portion of the film is later contacted during fabrication and functions as the gate contact tab. Because of this multiple utilization of the patterned metal film, the channel-adjacent source and drain junctions are automatically formed in perfect registry with the gate and the overlap between the gate and the source and drain junctions, respectively, may be maintained at a predesired minimum, commensurate with optimizing of the operating parameters of the device. In a commercially-feasible design, the device parameters may be optimized by an elongated, narrow-gate electrode which overlaps a short, wide channel. The geometrical configuration of the channel may be closed, as for example circular or rectangular, or open, as for example, a single straight line or an undulating linear pattern. In both instances, a portion of the gate is enlarged to facilitate contact thereto. The high conductivity of the gate material permits a discrete contact, as opposed to the contact to source and drain regions, which must be made over an extended area, due to the lesser conductivity of the semiconductor material of which source and drain are formed.

The formation of a simple IG-FET device in accord with the present invention is illustrated schematically by the flow diagram of FIG. 1 and the corresponding schematic representations of FIGS. 2*a*–2*f*, which correspond to the successive steps of the flow diagram of FIG. 1 and illustrate in vertical cross-sectional view the successive conditions of a portion of a silicon semiconductor wafer being fabricated into an IG-FET device in accord with the present invention. Although the present invention may be practiced to form IG-FET devices from a number of semiconductors such as germanium, silicon, gallium arsenide etc., for clarity of description, it will be described with respect to forming silicon IG-FET devices.

In FIGS. 1 and 2, a P-type silicon semiconductor wafer having a monocrystalline structure and a concentration of boron atoms therein of approximately $10^{16}$ atoms of boron per cc. of silicon, for example, and which may, for example, have a diameter of approximately one inch and a thickness of approximately 0.014 inch, is inserted into a reaction chamber. The next step in the formation of a plurality of IG-FET's on a wafer in accord with the present invention, is to form, on one major surface of the silicon wafer, a dielectric insulating thin film 11, which is utilized to separate the gate from the channel region of the semiconductor body and provide passivation for source and drain junctions. To facilitate this, a thin, thermally-grown oxide film may be formed by introducing dry oxygen into the reaction chamber while the silicon wafer is heated to a temperature of, for example, 1000° to 1200° C. A suitable thickness for a silicon dioxide, thermally-grown film is approximately 1000 A.U. Such a film may be grown by maintaining the aforementioned conditions for a period of approximately one hour.

Although, for convenience, the formation of a thermally-grown oxide has been described, it is also possible, and in some instances preferable, that a portion of the gate insulating film be comprised of another insulating material, for example, silicon nitride. Silicon nitride has a greater resistance to the diffusion of conventional donor and acceptor atoms therethrough and is often preferable to silicon dioxide. On the other hand, silicon dioxide is more readily etched to form gate and drain apertures through which appropriate dopants may be diffused into the silicon wafer to form source and drain regions. It is evident, therefore, that there is advantage to each. In some instances it may be desirable to first form a thin 1000 A.U. thermally-grown film of silicon dioxide, as described above, and then to form thereover a thin film of silicon nitride. Such a silicon nitride film may be formed by reacting $SiH_4$ and $NH_3$ at a temperature of 1000° C., at the surface of the uncoated or oxide-coated silicon wafer in the reaction chamber. Such a process may use a partial pressure of .015 torr of $SiH_4$ in an atmosphere of ammonia, and a 1000 A.U. thick film of silicon nitride may be formed in approximately 10 minutes.

Alternatively, a film of an amorphous nature and containing silicon, oxygen, and nitrogen, generally referred to as silicon oxynitride, may be utilized in lieu of the combination of silicon dioxide and silicon nitride films to form insulating film 11 on silicon substrate 12. The utilization of such films and methods of forming thereof is described in detail in the copending application of F. K. Heumann, Ser. No. 598,305, filed Dec. 1, 1966, and assigned to the present assignee, the entire disclosure of which is incorporated herein by reference thereto. Such a film may, for example, be formed by the pyrolytic decomposition of a silane, oxygen, and ammonia at the surface of a silicon wafer maintained at a temperature of approximately 1000° C. to 1200° C. Alternatively, the insulating film may be a composite of any order and number of separate, thin films. For example, separate 1000 A.U. films may comprise $SiO_2$, $Si_3N_4$, and finally, $SiO_2$ again.

After the formation of an insulating film 11 on silicon wafer 10, which is illustrated in FIG. 2*b*, a thin metallic film which may conveniently be molybdenum, tungsten, or, suitably, another refractory metal which is nonreactive with the adjacent insulating film 11, is formed on the surface of insulating film 11. For convenience and ease of description, such film will be described herein as being of molybdenum, since molybdenum is used in the preferred embodiment. Such a film may be of the order of 4000 A.U. thick, although thicknesses may range from 700 A.U. to approximately 10,000 A.U. A 4000 A.U. thick film may be formed by bombarding a molybdenum source in close juxtaposition to the oxide-coated silicon wafer held at 400° C. by argon ions, of for example 1500 volts energy, to cause sputtering of molybdenum from the source and deposition thereof upon the insulating film surface. This may be accomplished by a conventional triode sputtering in argon at a pressure of 5 x $10^{-3}$ torr for 15 minutes.

In the next step in practicing this embodiment of the invention, the deposited metal film, which may conveniently be molybdenum, is patterned by photolithographic techniques, as is well known to the art. In accord with these techniques, a photoresist material, as for example KPR, available from Eastman Kodak Company, Rochester, N.Y., is coated over the metallic film and a mask is positioned thereover, which mask permits the transmission of radiation therethrough to the portions of the surface whereat it is desired to retain the deposited molybdenum film. At the portions of the surface at which it is desired that the molybdenum film be removed, the photoresist is masked and, therefore, not exposed to light.

An appropriate geometry for an IG-FET device may, for example, be of circular geometry having a central circular drain region, an annular gate having an enlarged contact portion surrounding and overlapping the drain, and an annular source region surrounding and undercutting the gate, each having an enlarged tab portion for forming electrical contacts thereto.

For a single IG-FET device, an appropriate mask, therefore, would be one having a modified "bull's eye" configuration wherein the inner, circular portion remains, an annular portion thereabout is removed, and a second annular portion thereabout which remains.

The actual pattern for masking a plurality of IG-FET devices on a single wafer comprises a plurality of such patterns. Radiation is then passed through the mask to cause the photoresist to be exposed. Thereafter, the wafer is immersed in a developer for the photoresist, as for example Photoresist Developer, obtainable from Eastman Kodak Company. While immersed in the developer, those portions of the photoresist which were exposed to light, as for example, gate annulus 9 in FIG. 2*d*, remain as a dense and protective coating over the surface of molybdenum film 12. On the other hand, those portions of the photoresist coating in the regions of center portion 14 and annulus 13 in FIG. 3*d*, have been removed by dissolution in the developer and the molybdenum film 12 is exposed. After developing, the wafer is heated, as for example, to a temperature of approximately 150° C. for 40 minutes, for example to harden the film.

In accord with the next step in the formation of IG-FET devices in accord with the invention, a central drain hole 14 and an annular source hole 13 are cut by etching through molybdenum film 12 and insulating film 11. This may, for example, be accomplished by immersing the wafer in a ferricyanide etch, comprising 92 grams of potassium ferricyanide, 20 grams of potassium hydroxide, and 300 grams of water, to etch away the molybdenum exposed through the photoresist layer at a rate of 9000 A.U. per minute.

The insulating film 11, exposed by removal of molybdenum film 12 at regions 13 and 14 is next removed. If the insulating layer is silicon dioxide or silicon oxynitride, it may be readily removed by immersion in a "Buffered HF" etchant comprising one part concentrated HF and ten parts of a 40 percent solution of $NH_4F$, which etches silicon dioxide at a rate of approximately 1000 A.U. per minute. The etchant is utilized for the necessary time to remove the thickness of silicon dioxide present. Alternatively, if silicon nitride is utilized alone, a concentrated (48 volume percent) hydrofluoric acid etchant may be utilized. This etchant removes silicon nitride at a rate of approximately 130–150 A.U. per minute. Alternatively, an 85 percent solution of phosphoric acid, utilized at 180° C. may be utilized to etch silicon nitride at a rate of approximately 60–100 A.U. per minute. This alternative is desirable when the insulating film comprises $SiO_2$ and $Si_3N_4$. If any combination of these foregoing layers is utilized in sequential arrangement, each may be etched separately and washed prior to the next etch. After etching of the source and drain holes, the photoresist is removed in a suitable manner, as for example, by scrubbing in trichloroethylene. Formation of source and drain holes 13 and 14, also defines an annulus 15 in film 12 which is to be the gate of the resulting IG-FET.

The formation of the source and drain holes 13 and 14 respectively, in the molybdenum and insulating films on wafer 10 and simultaneous definition of the gate 15, in accord with the present invention, is greatly advantageous over prior art practices. In accord with prior art practices, the desired result is achieved by the patterning of source and drain holes in one step and patterning of the gate in another step, by means of separate masks, and the exercise of a great degree of care in the sequential application of the masks to achieve registry between source drain and gate.

In accord with this embodiment of this invention, the molybdenum film 12 is first etched to form a pattern and may further be used as an etching mask and subsequently, in combination with the patterned insulating film, as a diffusion mask. The utilization of molybdenum as an etch mask for insulating-passivating materials is disclosed in greater detail in the copending application of Tiemann et al., Ser. No. 606,242, filed Dec. 30, 1966, and assigned to the present assignee, the entire disclosure of which is incorporated herein by reference thereto.

The etched wafer (or at least that portion thereof constituting a single IG-FET device in the process of fabrication at this point) is illustrated in FIG. 2*d*.

In the next step in the preparation of an IG-FET device in accord with the present invention, regions of N-type conductivity characteristics are formed by diffusion of a donor activator impurity such as phosphorus, antimony, or arsenic into the surface-adjacent regions of silicon wafer 10, at which insulating film 11 and molybdenum film 12 have been etched away to form source and drain holes 13 and 14, respectively. This modification of the original P-type conductivity characteristic of wafer 10 may conveniently be achieved by first heating the wafer for approximately one half hour to a temperature of approximately 1000° C. in a reaction vessel, wherein a quantity of phosphorus pentoxide is maintained at a temperature of 250° C. The $P_2O_5$ volatilizes and reacts with the exposed silicon wafer 10 beneath source and drain holes 13 and 14 to form regions 16 and 17 doped with phosphorus. The wafer is then heated to 1100° C. for four hours, for example, in an argon atmosphere to cause phosphorus to diffuse further into the wafer and form source and drain type regions 16 and 17, respectively, which are located beneath source and drain holes 13 and 14, respectively.

Although the invention is herein, for purposes of conciseness, described with reference to an "N-channel" type IG-FET, having N-type source and drain regions in a P-type wafer with an N-type surface channel between source and drain, a "P-channel" type IG-FET device may be made by diffusing an acceptor activator impurity, as for example boron, into an N-type conductivity wafer, resulting in P-type source and drain regions and a P-type surface channel therebetween.

As is illustrated in FIG. 2*e* of the drawing, the source and drain regions 16 and 17, respectively, due to lateral diffusion, slightly undercut the portion of the oxide film 11 which remains and which is covered by the patterned portion of molybdenum film 12. Source and drain junctions 18 and 19, respectively, are formed where regions 16 and 17 border on the remainder of wafer 10. Junctions 18 and 19 intersect the surface of wafer 10 to form closed geometrical patterns. The molybdenum annulus 15 surrounding drain aperture 14 constitutes the gate of an IG-FET device and, as may be seen from the illustration of FIG. 2*e*, the utilization of gate 15 and underlying coextensive insulating film as a diffusion mask insures automatic registry between channel-adjacent source and drain regions, on one hand, and gate electrode, on the other hand. The source and drain regions may be caused to extend any convenient lateral distance under the gate, which distance may be readily controlled by controlling the temperature and time of the phosphorus diffusion step.

As is mentioned hereinbefore, great advantage, in addition to the automatic registry feature obtained by utilizing the gate and coextensive underlying insulating film as a diffusion mask, is obtained by forming devices having a minimum of overlap between source and drain regions, on one hand, and gate, on the other hand, thereby minimizing inter-regions capacitance, permitting high-frequency operation. This is due, in part, to the ability to make gate 15 very small and still have overlap due to the automatic registry feature.

As a final step in the preparation of a field-effect transistor in accord with the present invention, electrical contact is made to the source and drain region and to the gate, as well as to the P-type conductivity portion of the wafer to form a base contact.

Conveniently, contacts to source, drain, and gate may be made by masking the wafer with a pattern of a photoresist to cover all except the regions at which source and drain contacts are to be made and evaporating, in vacuum, a thin film of aluminum over the entire surface of the masked wafer. The remaining portions of the photoresist film, together with the aluminum deposited thereon is removed, as before. Electrode contacts are made to the aluminum covering source and drain regions and to the gate to form source, drain, and gate electrical contacts. Contacts to the base region may be made by alloying the base to a suitable header.

FIG. 5 of the drawing illustrates the configuration of a finished IG-FET device, as fabricated above, in accord with the invention. In FIG. 5, passivated wafer 10 is covered with a molybdenum film 12, an incomplete annulus 1 comprises an aluminum source electrode and includes an enlarged tab 2 for making electrical contact 3 thereto as, for example, by thermo-compression bonding. A second annulus 15 comprises the gate and includes enlarged tab 4 for making electrical contact 5 thereto. A central aluminum circular region 6 comprises the drain electrode, to which electrical contact 7 is centrally made by thermo-compression bonding, for example.

It should be appreciated that the drawings are schematic and are not intended to represent proper scale, particularly with respect to relative dimension. Thus, for example, films 11 and 12 and regions 16 and 17, as well as the channel spacing therebetween are so small that, if drawn to scale, they might not be visible.

Figure 4:
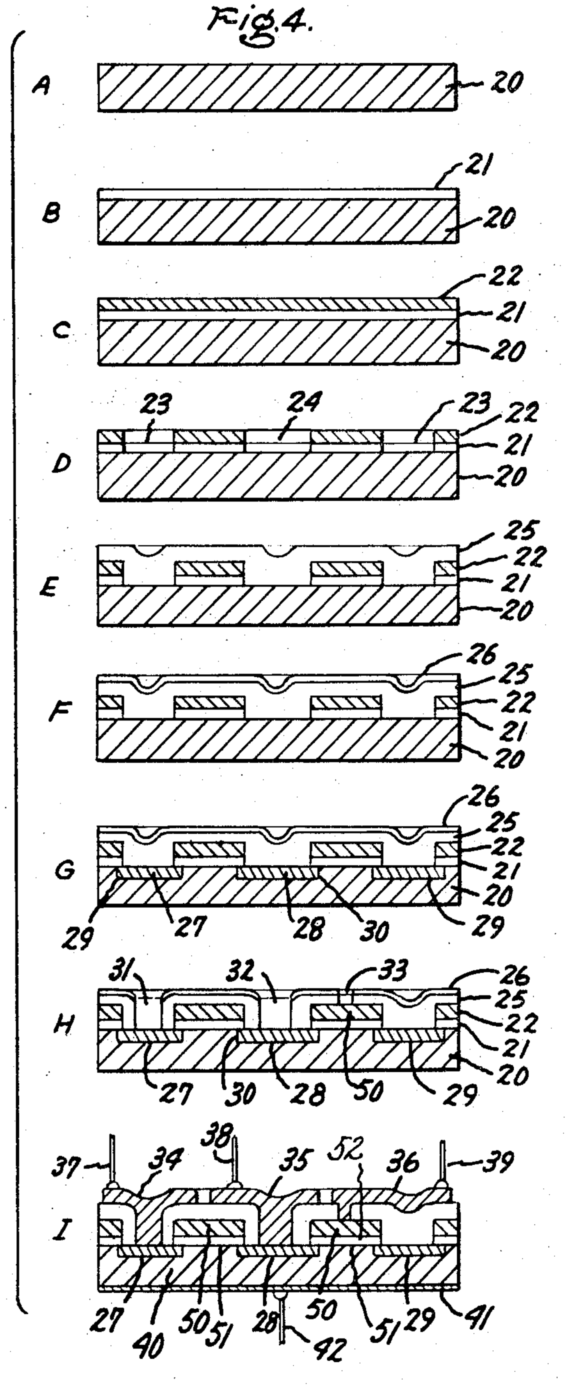

In accord with another embodiment of the invention, a somewhat more elegant IG-FET device, having improved passivation characteristics and improved protection from ambient, in accord with an alternative process, which is illustrated schematically by the flow diagram of FIG. 3 and by the schematic diagrams of FIGS. 4*a–i*, which represent a portion of a P-type silicon wafer upon which a single IG-FET device is fabricated in accord with the steps illustrated in the flow diagram of FIG. 3, each illustration in FIG. 4 corresponding to the condition of the silicon wafer after the step of the corresponding portion of the flow diagram has been performed.

A plurality of N-channel IG-FET devices may be fabricated upon a P-type silicon wafer 20 having a doping level of approximately $10^{16}$ atoms of boron per cc. of silicon. Alternatively, a P-channel IG-FET device may be made using an N-type silicon wafer doped, for example with $10^{16}$ atoms or phosphorus per cc. of silicon, and diffusing acceptor activators therein, as is described hereinbefore. In the case of an N-channel device, an insulating-passivating layer 21, is formed over one major surface of P-type wafer 20 by thermally growing a film of silicon dioxide in a dry oxygen atmosphere, or by the formation of a film of silicon nitride by the reaction of $SiH_4$ and $NH_3$ at the surface of the silicon wafer at a temperature of approximately 1100° C. Alternatively, a thin film of silicon oxynitride may be formed upon the surface of silicon wafer 20 by the reaction of a mixture of $SiH_4$, $NH_3$, and oxygen at the surface of the silicon wafer at 1100° C.

After the formation of insulating film 21, a thin film 22 of a refractory metal, as for example molybdenum, is formed upon the surface of insulating-passivating film 21. The formation of the insulating and the molybdenum films 21 and 22, in this embodiment of the invention, are essentially as described with respect to the embodiment of FIGS. 1 and 2. As with the embodiment of FIGS. 1 and 2, source and drain holes 23 and 24, respectively, are etched in molybdenum film 22 to the surface of the silicon wafer 20, utilizing the appropriate etch for a time sufficient to remove, first, the molybdenum film not covered by a photoresist pattern upon the surface of the molybdenum film and, secondly, by utilizing the molybdenum film, with the photoresist thereupon, as an etch mask to remove the passivating-insulating film 21 in those portions at which it is desired to form source and drain regions, as is described with respect to the embodiment of FIGS. 1 and 2.

After removal of the photoresist from the patterned molybdenum film subsequent to etching of the source and drain holes, as described hereinbefore, a clean, undoped film 25 of silicon dioxide which may, for example, be of the order of 1000 A.U. in thickness, may be formed over the surface of the entire wafer. Such a film may, for example, be formed by pyrolysis of ethyl orthosilicate upon the heated wafer. The portion of the silicon wafer comprising one IG-FET device, after these steps, is illustrated schematically in FIG. 4*e* of the drawing.

After the formation of the undoped film 25 of silicon dioxide over the patterned wafer, a film 26 of insulator doped with the desired donor activator impurity, as for example, a one percent doped phosphorus "glass" having a thickness, for example, of approximately 2000 A.U., is deposited over the first-deposited film 25. This may be achieved, for example, by pyrolysis of ethyl orthosilicate and triethyl phosphate in a 10:1 volume ratio to form phosphorus-doped silicon dioxide. Film 26 of doped glass is utilized as the source of activator impurities for causing conductivity modification of source and drain regions for the IG-FET device. Film 26 may conveniently be deposited upon the surface of the wafer by permitting vapors of the chemical constituents in argon gas to flow over the wafer which is heated to a temperature of approximately 800° C. Growth rates of 400 A.U. per minute of the doped "glass" may be achieved in this manner. Appropriate vapor pressure concentrations may be achieved, for example, by bubbling dry, high-purity argon through liquid dopant-containing substances, as for example 7 cubic feet per hour through ethyl orthosilicate and 0.7 cubic feet per hour through triethyl phosphate.

After deposition of the phosphorus-doped glass, the wafer is heated, as for example, to a temperature of approximately 1100° C. for a time of approximately 2 to 16 hours depending upon the thickness of glass to be permeated, to cause penetration of the phosphorus atoms through film 25 and diffusion into the surface-adjacent regions 27 and 28 of silicon wafer 20, through source and drain apertures 23 and 24, respectively, thereby changing the conductivity type thereof to N-type. Since source and drain are diffused simultaneously and under identical conditions, penetration into wafer 20 and laterally under gate 50 is the same for both.

It is not necessary that film 25 be formed prior to the formation of doped glass film 26. For example, a suitable film 26, which may vary from 500 A.U. to 10,000 A.U. thick may be formed directly on the patterned wafer. A desirable condition to be achieved is that, subsequent to diffusion to form source and drain regions, and prior to formation of source and drain electrodes, a substantial thickness of, for example, 5000 to 15,000

A.U. of insulator should overlie the film 22. This may be achieved by proper selection of the thickness of films 25 and 26, or alternatively, an undoped film may be deposited over film 26 either before or after diffusion. Then end result of this process is a "triple passivation" wherein the interesections of the source and drain junctions with the surface of wafer 20, are covered sequentially, by films of a first insulator, then metal, and finally by the last-deposited insulator. In this configuration, the junctions are not only passivated, but electroastatically shielded.

One problem which may arise when this diffusion step takes place is that activator atoms may adversely affect the metallic film. This may be avoided if the sequence of the steps is modified so that the first-deposited undoped oxide film 25 is formed before holes 23 and 24 are etched through films 21 and 22. Then, when holes 23 and 24, are etched through films 21, 22, and 25, doped glass film 26 is directly deposited on wafer 20 in holes 23 and 24, but film 25 is interposed between film 26 and metallic film 22. Thus, when diffusion is carried out to form regions 27 and 28, dopant does not penetrate film 25 to affect film 22.

Region 27 constitutes a source region, having an annular configuration, slightly underlying the portion of the passivating film 21 remaining under the remaining portions of the molybdenum layer 22. Region 28 constitutes a drain region having a circular configuration slightly underlying passivation film 21 under film 22. Thus, the source and drain P-N junctions 29 and 30, respectively, intersect the surface of the silicon wafer, to form closed geometric patterns, for example an annulus and a circle, respectively, at regions over which the passivating film 21 covers the silicon wafer surface. These junctions are thus passivated and undesired surface effects are prevented. As with the embodiment of the invention described with respect to FIGS. 1 and 2, the degree by which the source and drain regions equally undercut the gate 50 may be regulated by controlling the temperature of the diffusion step and the time during which the step is conducted, in order to maintain the degree of overlap at a minimum, consistent with the attainment of passivation of the source and drain P-N junctions 29 and 30, respectively, and yet maintaining a minimum capacitance between source and drain regions, on one hand, and the gate, on the other hand. Due to the feature of automatic registry and close control, laterial and vertical diffusion are substantially equal and may be very limited to define shallow depths, for example several microns. In general, for a given temperature of diffusion the depth of penetration, and lateral diffusion, varies as the square root of the diffusion time.

After the diffusion step which forms source and drain regions 27 and 28, respectively, contact is made to these regions and to the gate. Conveniently, this may be done by coating the entire surface of the wafer with a photoresist material and exposing all of the surface of the photoresist except those regions at which it is desired to form the source, drain, and gate contacts. These regions are within the apertures in film 21 corresponding to the source and drain regions and over the enlarged portion of the gate. While contact need be made to the gate only in one portion thereof, due to the high electrical conductivity of the metallic gate, contact to the source region is made over substantially the complete angular extent thereof, the width of the contact being somewhat less than the width of the source aperture 23, so that the passivation and insulation of the device is unaffected by this formation of the source contact aperture. Similarly, contact to the drain region is made somewhat smaller than the drain aperture 24 for the same reason.

After exposing and developing of the photoresist so as to remove the portions thereof over the portions of oxide film 25 at which source contact aperture 31, drain contact aperture 32, and gate contact aperture 33 are to be made, the wafer is immersed in a suitable etchant, as for example, buffered HF etchant, to remove silicon dioxide, for example, as described hereinbefore, for a sufficient time to etch down to the source and drain regions of the silicon and to the enlarged portion of the molybdenum gate, with which the etchant is nonreactive. Conveniently, the wafer may be immersed for a period of approximately three minutes to accomplish this etching of a 3000 A.U. silicon dioxide film.

After apertures 31, 32, and 33 have been made to source, drain, and gate, respectively, electrical contact is made by forming a metallic film which fills these apertures and contacts the source and drain regions and the gate electrode. Such metallizing may, for example, be achieved by vacuum evaporating an aluminum film, for example. After the formation of a metallic film, a photoresist pattern is formed upon the surface of the metallic film, the pattern covering those regions immediately over the drain electrode region, the gate contact aperture, and the source electrode region, the remainder of the aluminum film being uncovered. The wafer is immersed in a suitable etchant for aluminum, as for example, a phosphoric acid etch, for a suitable time and removed. Three discrete electrode contact-making regions, the source contact region 34, the drain contact region 35, and the gate contact region 36 remain. Source and drain electrodes each have an enlarged tab for making electrical contact thereto as does the gate. Electrical contact leads 37, 38, and 39 are made to source electrode, drain electrode, and gate electrode, respectively, as for example, by thermo-compression bonding. Electrical contact is made to the base region 40 of the silicon wafer by a metal film 41 of a metal, which forms ohmic contact thereto, as for example, aluminum, and connecting a contact lead 42 thereto, or by alloying region 40 to a suitable header. The resultant IG-FET device is illustrated in a schematic vertical cross-sectional view in FIG. *4i* of the drawing.

The device of FIG. *4i* constitutes an improved IG-FET device, typical of those which may be constructed in accord with the present invention. In this device, automatic registration of the channel-adjacent source and drain regions with the gate is secured by virtue of that feature of the invention whereby the metallic film is patterned, as described hereinbefore, to define gate 50 which overlies channel 51 and is coextensive with gate insulator 52 and utilized as the gate. Thus, when diffusion of an opposite conductivity-type impurity into the main body of the silicon wafer is accomplished, the surface-adjacent, conductivity-modified regions so formed, automatically extend to any desirable and predetermined, distance beneath the gate, thus insuring controlled overlapping of the gate over the channel-adjacent portions of source and drain regions. This is accomplished without the necessity of first forming source and drain regions by diffusion, utilizing an etch mask which is formed by photoresist and etching techniques and, at a later stage, forming a gate region by a separate masking technique, utilizing photoresist and etching techniques, which requires the necessity of insuring that the first mask and the second mask are applied in precise registry.

As mentioned hereinbefore, devices in accord with the present invention may be formed in either a closed or an open configuration. For ease of description, the foregoing examples have been directed to the closed configuration. It is to be understood that, with obviously necessary modifications, the same basic sequence of process steps is used to form IG-FET's of open configuration. In one such embodiment metallic film is first formed over an insulating film and patterned into a strip having an enlarged contact-making end. Subsequently, the metallic strip is patterned into a thinner strip to form channel-adjacent portions thereof into a gate at the time that the source and drain apertures are formed in a single photolithographic step. In accord with another embodiment, a high quality insulator having a first thick portion, and a second central thin portion, comprising the active portion of the device, is formed upon a silicon substrate, for example. A metallic film is formed thereover and patterned to form a gate, narrow in the thin insulator region, with the enlarged contact-making portion over the thick insulator portion. The insulating film is then etched to reduce the thickness of both portions thereof by an amount sufficient to form source and drain holes adjacent the patterned metallic film in the thin insulator film region. Source and drain regions are then diffused in the thin insulator region, as described above, and are in automatic registry with the gate, which in this instance, was used as an etch mask, insuring registry.

In further accord with the present invention, the amount of overlap between the channel-adjacent portions of the source and drain regions, on one hand, and the gate, on the other hand, may be conveniently and readily controlled so as to minimize interregion capacitance by carefully controlling the temperature and time of the cycle which causes diffusion of the activator impurities into the source and drain regions, so as to cause overlap of the source and drain regions along the entire width of the channel-adjacent regions thereof with the gate, with minimum of penetration under the gate. This also results in a minimum depth of penetration into the wafer, another desirable feature.

In accord with another feature of this embodiment of the present invention, a thick film of insulating material is formed over the patterned wafer prior to diffusion and formation of the source and drain regions, these regions are already protected by a thick insulating layer, and it is unnecessary to subject the device to any further heating step, to cause the formation or deposition of an insulating film, which later heating step may deleteriously affect the already-formed semiconductor device.

A plurality of IG-FET devices in accord with one embodiment of the present invention, is formed substantially as follows: a one inch diameter 0.014 inch thick disc of monocrystalline P-type silicon, having a concentration of boron of $10^{16}$ atoms per cc. therein, is placed in a reaction chamber and heated in dry oxygen for one hour at a temperature of 1100° C. to form a thin silicon dioxide film of 1000 A.U. thickness on the surface of the wafer. A 5000 A.U. thick film of molybdenum is formed over the oxide layer by sputtering in a triode glow discharge configuration at a voltage of 1500 volts in an atmosphere of $5\times10^{-3}$ torr of pure argon for 20 minutes from a sheet of molybdenum, at a spacing of 5 cm. between the molybdenum sheet and the wafer, with the wafer maintained at a temperature of approximately 400° C. A film of KPR photoresist is applied upon the molybdenum film and a mask having a modified bull's eye pattern with an opaque central portion with a 0.005 inch diameter, a transparent annular portion having a radial thickness of 0.00025 inch, concentric with the central portion, having a 0.003 inch diameter enlarged contact-making portion, and an opaque annulus having an enlarged, 0.003 inch diameter, contact making tab and a radial thickness of 0.002 inch surrounding the annular transparent portion and concentric therewith. This pattern has a total extent of 0.012 inch and is repeated at a density of 2500 patterns per square inch. The masked wafer is then irradiated for ten seconds to expose the KPR and is washed for five minutes in photoresist developer to remove the unirradiated portions thereof. After developing of the photoresist in the developer, the wafer is heated to 150° C. for approximately 40 minutes to further fix and harden the developed KPR pattern.

After heating of the wafer, it is immersed in a ferricyanide etch bath for approximately one minute, to cause the molybdenum not covered by the photoresist to be etched away, to define source and drain regions for each of the IG-FET modules. After removal from the ferricyanide etch and washing in distilled water, the wafer is immersed in a buffered HF etch for approximately one minute, to cause removal of the silicon dioxide exposed by the patterning of the molybdenum film. After removing from the buffered HF etchant and washing in distilled water, the wafer is inserted in a reaction chamber along with a crucible containing 50 grams of dry $P_2O_5$, while the wafer is heated to a temperature of 1100° C., and the $P_2O_5$ heated to 250° C. The cycle is continued for 20 minutes. During this time phosphorus atoms diffuse into the exposed portions of the silicon wafer, and form source and drain surface-adjacent regions of N-type conductivity. These regions extend to a depth of approximately two microns, fully converting the exposed surface-adjacent regions of the silicon and penetrating two microns under the diffusion mask and the gate.

The diffused silicon wafer is then covered with a stencil mask of KPR having openings corresponding to source and drain regions leaving a 0.0005 inch clearance on all sides and covered with a .5 micron thick film of aluminum by vacuum evaporation. The aluminum within the apertures function as source and drain electrodes. This is accomplished with the substrate at a room temperature and evaporation is continued for approximately 20 seconds. After evaporation of the aluminum, the patterned photoresist film and the aluminum overlying the KPR is then removed by scrubbing with trichloroethylene. The wafer is then heated to a temperature of 570° C. for one minute in forming gas to reduce electrode contact resistance. The wafer is then cut into separate pieces, each of which contains a separate IG-FET device. Electrical contacts are made by forming thermo-compression bonds to the enlarged portions of source and drain electrodes and to the enlarged portions of the gate using a gold wire at 350° C.; and contact is made to the base region by alloying the base region of the silicon to a gold-plated Kovar header. This device has an N-channel length (distance between source and drain junctions) of approximately two microns.

In accord with another example of the formation of IG-FET devices in accord with the present invention, a $10^{16}$ atoms per cc. boron-doped P-type silicon, monocrystalline wafer having a diameter of one inch and a thickness of 0.014 inch is heated for one hour at a temperature of 1100° C. in an atmosphere of dry oxygen to cause the formation of a 1000 A.U. thick silicon dioxide layer. The wafer is next subjected to a triode sputtering step, as in the previous example, to form a 5000 A.U. thick film of molybdenum. The molybdenum film is coated with a patterned coating of KPR photoresist and is then patterned by etching in a ferricyanide etch in the desired configuration to form a modified bull's eye pattern of 2500 patterns per square inch and the same source and drain dimensions as in the previous example, except that the enlarged portion of the gate (specified as a 0.003 inch diameter circle in the previous example) is, in this example made in the form of a circle of 0.001 inch in diameter.

The patterned wafer is then washed in distilled water and immersed in buffered HF to remove the exposed portions of the thermally-grown oxide film. The entire wafer is covered with a 1000 A.U. thick film of phosphorus doped $SiO_2$ by pyrolysis from argon saturated in a 1:10 ratio with vapors of triethyl phosphate and ethyl orthosilicate while the substrate is maintained at a temperature of 800° C. To accomplish this, dry argon is bubbled through an ethyl orthosilicate fluid at a flow rate of approximately 7 cubic feet per hour and becomes saturated with the ethyl orthosilicate. Similarly, dry argon is bubbled through triethyl phosphate at a flow rate of 0.7 cubic feet per hour. The argon flows are mixed and passed over the heated wafer and a film of phosphorus-doped silicon dioxide is thereby pyrolytically deposited over the entire wafer. To form a 2000 A.U. thick film, the process is carried out for five minutes.

Next, a 5000 A.U. thick film of undoped silicon dioxide is deposited over the doped film of silicon dioxide, substantially as above, with the flow through the triethyl phosphate deleted. The process is carried out for 20 minutes.

The coated wafer is then heated to a temperature of 1100° C. for 20 minutes during which the phosphorus in the first-deposited silicon dioxide film diffuses into the contacted surface-adjacent regions of the silicon wafer exposed to the doped glass to form concentric, diffused, conductivity-modified source and drain regions two microns deep. After diffusion, the wafer is coated with a layer of photoresist and patterned to form contact apertures which correspond to and are somewhat smaller than the apertures in the molybdenum film and the enlarged portion of the gate annulus, as described hereinbefore, to insure the maintenance of good passivation of the device junctions. The contact apertures to the drain are circular, centrally located, and have a diameter of 0.004 inch. The contact aperture to the source is a 270° sector of an annulus having a radial thickness of 0.001 inch and is centrally radially located with a respect to the annular source region. The contact aperture to the gate is circular and has a diameter of 0.0005 inch and is centrally located with respect to the enlarged region of the gate annulus. Aluminum is then vacuum-evaporated over the entire surface, filling the source, drain, and gate contact apertures, making contact to source, drain, and gate. The aluminum film is selectively removed by photoresist masking, irradiation, and developing, as is well known to the art, leaving 0.003 inch portions in electrical contact with the aluminum-filled apertures and electrically isolated from one another. The wafer is then heated to improve electrical contact, as in the previous example. Source, drain, and gate contacts are made, as before, as is the base contact.

By the foregoing, it is apparent that we have described new and improved IG-FET devices having the features of self registration of channel-adjacent source and drain regions, on one hand, and gate, on the other hand, with a small, readily-controllable degree of overlap of source and drain regions with the gate resulting in heretofore unobtainably small-channel lengths concurrently therewith. We have further disclosed a device having improved source and drain junction passivation. The foregoing devices are formed by an improved method wherein a metallic film, such as tungsten or molybdenum, is formed upon an insulator-coated wafer of silicon and is patterned by a single photolithographic process which also defines the channel-adjacent portions of source and drain holes. This process provides automatic registration between channel-adjacent source and drain regions, on one hand, and gate, on the other hand, the overlapping of which may be maintained small and readily controlled by the control of temperature and time of diffusion, to form source and drain regions, and insures the concurrent achievement of small-channel lengths.

While the invention has been disclosed herein with respect to certain embodiments and alternatives, many modifications and changes will readily occur to those skilled in the art. Accordingly, by the appended claims we intend to cover all such modifications and changes as fall within the true spirit and scope of the present invention.

What we claim as new and desire to secure by Letters Patent of the United States is:

1. The method of making self-registered, field-effect transistors including a semiconductor body of one conductivity-type, source and drain surface-adjacent regions of opposite-type conductivity defining therebetween a surface-adjacent channel within said body, and a gate juxtaposed adjacent the surface of said body and covering said channel, which method comprises the steps of:

(a) forming upon one major surface of said semiconductor body a thin film of an insulating material, (b) depositing over said film of insulating material a film of an electrical conductor which is chemically and mechanically stable and nonreactive with said insulating material at activator-diffusion temperatures of the order of 1100° C., (c) forming a pattern in said electrically-conducting film and said insulating film, ($c_1$) said pattern containing an electrically-conductive remaining portion constituting said gate and defining channel-adjacent regions of said source and drain, (d) thermally diffusing at temperatures the order of 1100° C. an activator impurity into said wafer and converting said surface-adjacent regions of said semiconductor body to opposite conductivity-type through said patterned films to form source and drain regions, and (e) making electrical contact to said source and drain regions and to said gate portion of said patterned conducting film.

2. The process of claim 1 wherein said conducting film is metallic.

3. The process of claim 2 wherein said activator impurity is introduced into said semiconductor body by diffusion from a gaseous phase.

4. The process of claim 2 wherein said activator impurity is introduced into said semiconductor by diffusion from a previously-deposited film of an activator-rich, insulating layer which remains in place to form a protective coating over said wafer.

5. The process of claim 2 wherein said insulating film includes one or more of the materials selected from the group consisting of silicon oxide, silicon nitride, and silicon oxynitride in any order and sequence, both repetitive and nonrepetitive.

6. The process of claim 5 wherein said insulating film comprises a first film of silicon dioxide and a second film containing silicon nitride.

7. The process of claim 2 where said insulating film is silicon dioxide.

8. The device of claim 2 wherein said metallic film is selected from the group consisting of molybdenum and tungsten.

9. The process of claim 2 wherein said gate completely laterally surrounds one of said surface-adjacent, conductivity-modified regions.

10. The method of claim 2 wherein said gate acts as a diffusion mask during the formation of said source and drain regions.

11. The process of claim 1 wherein said diffusion step is carried out at values of temperature and time to allow only sufficient lateral diffusion of said impurities within said semiconductor body as to avoid excessive over-lapping to minimize interregion capacitance.

References Cited

UNITED STATES PATENTS

| | | | |
|---|---|---|---|
| 3,165,430 | 1/1965 | Hugle | 29—571 |
| 3,200,019 | 8/1965 | Scott et al. | 29—578 |
| 3,387,358 | 6/1968 | Heiman | 29—571 |
| 3,411,199 | 11/1968 | Heiman et al. | 29—578 |
| 3,472,710 | 10/1969 | Welty | 29—577 |
| 3,572,712 | 10/1969 | Bower | 29—571 |
| 3,481,030 | 12/1969 | Te Velde et al. | 29—571 |

JOHN F. CAMPBELL, Primary Examiner

W. TUPMAN, Assistant Examiner

U.S. Cl. X.R.

29—578; 317—235